United States Patent
Chiba et al.

(10) Patent No.: US 6,272,202 B1
(45) Date of Patent: Aug. 7, 2001

(54) EXPOSURE METHOD AND X-RAY MASK STRUCTURE FOR USE WITH THE SAME

(75) Inventors: Keiko Chiba, Utsunomiya; Shunichi Uzawa, Tokyo; Mitsuaki Amemiya, Oomiya; Yutaka Watanabe, Tochigi-ken, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/426,945

(22) Filed: Oct. 26, 1999

(30) Foreign Application Priority Data

Oct. 29, 1998 (JP) .................................................. 10-322966

(51) Int. Cl.$^7$ ...................................................... G21K 5/00
(52) U.S. Cl. ................................................. 378/34; 378/35
(58) Field of Search ........................... 378/34, 35; 430/5; 437/147, 148

(56) References Cited

U.S. PATENT DOCUMENTS

| | | | |
|---|---|---|---|
| 4,898,837 | * 2/1990 | Takeda et al. | 437/31 |
| 5,262,257 | * 11/1993 | Fukuda et al. | 430/5 |
| 5,434,648 | * 7/1995 | Koga et al. | 355/76 |
| 5,468,577 | 11/1995 | Bae | 430/5 |
| 5,565,379 | * 10/1996 | Baba | 437/183 |
| 5,604,779 | * 2/1997 | Amemiya et al. | 378/34 |

FOREIGN PATENT DOCUMENTS

| | | |
|---|---|---|
| 28 35 363 | 3/1980 | (DE) . |
| 44 20 409 | 12/1994 | (DE) . |
| 0 020 132 | 12/1980 | (EP) . |
| 62-291660 | 12/1987 | (JP) . |
| 2-110311 | 4/1990 | (JP) . |
| 407312339 | * 11/1995 | (JP) . |

* cited by examiner

Primary Examiner—Robert H. Kim
Assistant Examiner—Irakli Kiknadze
(74) Attorney, Agent, or Firm—Fitzpatrick, Cella, Harper & Scinto

(57) ABSTRACT

An exposure method for printing a pattern onto a workpiece to be exposed, includes a first exposure step for forming, on the workpiece and by exposure, a transferred image of a first absorbing material pattern formed on a mask and having no periodic structure, and a second exposure step for printing, on the workpiece and by exposure, a diffraction pattern to be produced through Fresnel diffraction due to a second absorbing material pattern formed on the mask and having a periodic structure, the diffraction pattern having a period corresponding to 1/n of a period of the transferred image of the periodic structure pattern, where n is an integer not less than 2, and wherein the first and second exposure steps are performed simultaneously.

17 Claims, 8 Drawing Sheets

EXPOSURE METHOD AND X-RAY MASK STRUCTURE FOR USE WITH THE SAME

FIELD OF THE INVENTION AND RELATED ART

This invention relates to an exposure method and, more particularly, to a proximity exposure method using X-rays, for example. The exposure method of the present invention is suitably applicable to the manufacture of various microdevices such as a semiconductor chip (e.g., IC or LSI), a display device (e.g., a liquid crystal panel), a detecting device (e.g., a magnetic head), and an image pickup device (e.g., a CCD), for example.

FIG. 1 shows an example of an X-ray proximity exposure apparatus of a known type (Japanese Laid-Open Patent Application No. 2-100311). Denoted in the drawing at 1 is an X-ray source (light emission point) such as synchrotron orbital radiation (SOR), and denoted at 2 is an SOR X-ray beam being expanded in an X direction into a slit-like shape. Denoted at 3 is a convex mirror, made of SiC, for example, for expanding the slit-like X-ray beam 2 in a Y direction.

Denoted at 2a is the X-ray beam having been expanded by the convex mirror 3 into an area shape. Denoted at 7 is a workpiece to be exposed, such as a semiconductor wafer having been coated with a resist, for example. Denoted at 10 is a mask. Denoted at 4 is a beryllium film for isolating an ambience at the SOR side and an ambience at the mask (and workpiece) side from each other. Denoted at 5 is a focal plane type shutter being provided for exposure amount adjustment. In an exposure operation, the mask 10 and the workpiece 7 are placed with a spacing (gap) of about 10 microns maintained therebetween. As the shutter 5 is opened, a slit-like high-luminance X-ray beam 2 from the SOR, for example, and being expanded into an area shape (X-ray beam 2a) by the convex mirror 3, is projected to the mask 10 and then to the workpiece 7, by which a pattern image of the mask 10 is transferred to the workpiece 7 at a unit magnification.

As regards the X-rays in this case, a wavelength of about 0.5–20 nm is used. Therefore, in connection with the wavelength only, theoretically, a very high resolution of 0.05 micron (50 nm) or less will be obtainable. Practically, however, such a high-resolution mask itself is difficult to manufacture. If a mask of a nominal smallest linewidth of 0.05 micron is manufactured by use of a technique for production of a conventional mask of a smallest linewidth of 0.1 micron (100 nm), any positional error or any error in the line-and-space (linewidth and spacing) of a pattern produced will be transferred to a workpiece as a mask defect. It will cause a void in the pattern to be formed, or a positional deviation of the pattern. Further, a produced mask pattern may not have a proper linewidth or a sufficient thickness. On these occasions, a sufficient contrast will not be attainable, and the pattern will not be resolved satisfactorily.

SUMMARY OF THE INVENTION

It is accordingly an object of the present invention to provide an exposure method by which a pattern can be formed at a higher resolution and a higher precision, on the basis of a currently available X-ray exposure apparatus and a mask which can be produced in accordance with a current technique.

It is another object of the present invention to provide an exposure method which enables accomplishment of resolution even in a strict condition under which the contrast is too low and the resolution is currently difficult to accomplish.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the accompanying drawings.

[First Embodiment]

Figure 2A:
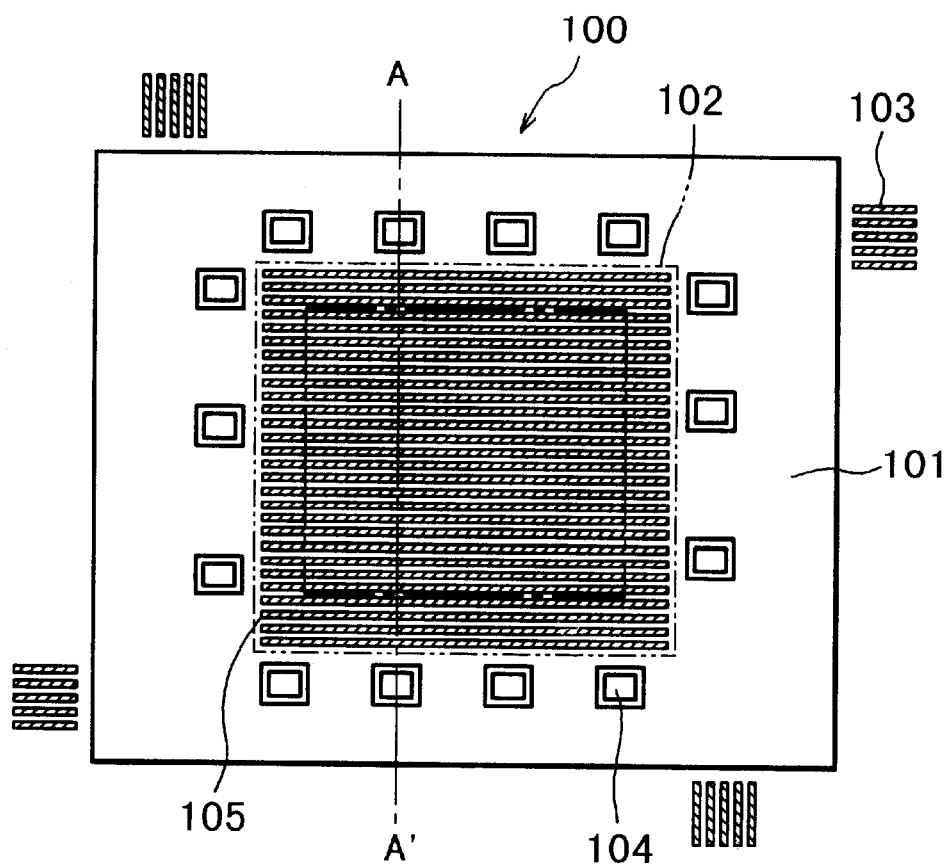
FIG. 2A is a schematic and plan view for explaining the structure of a mask for use in the manufacture of semiconductor devices, according to an embodiment of the present invention.
Figure 2B:
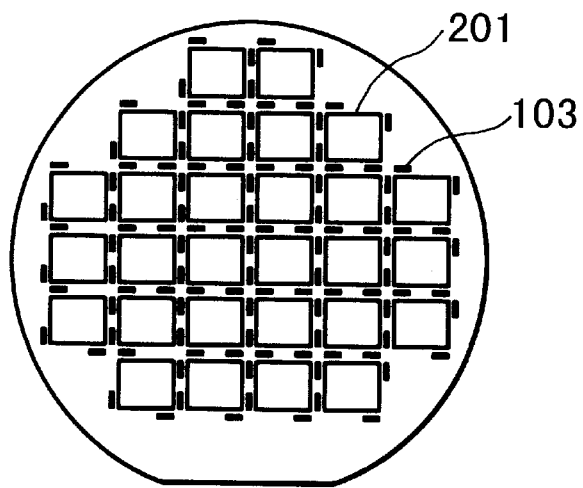
FIG. 2B is a plan view for explaining positions of alignment marks upon a semiconductor wafer.
Figure 3:
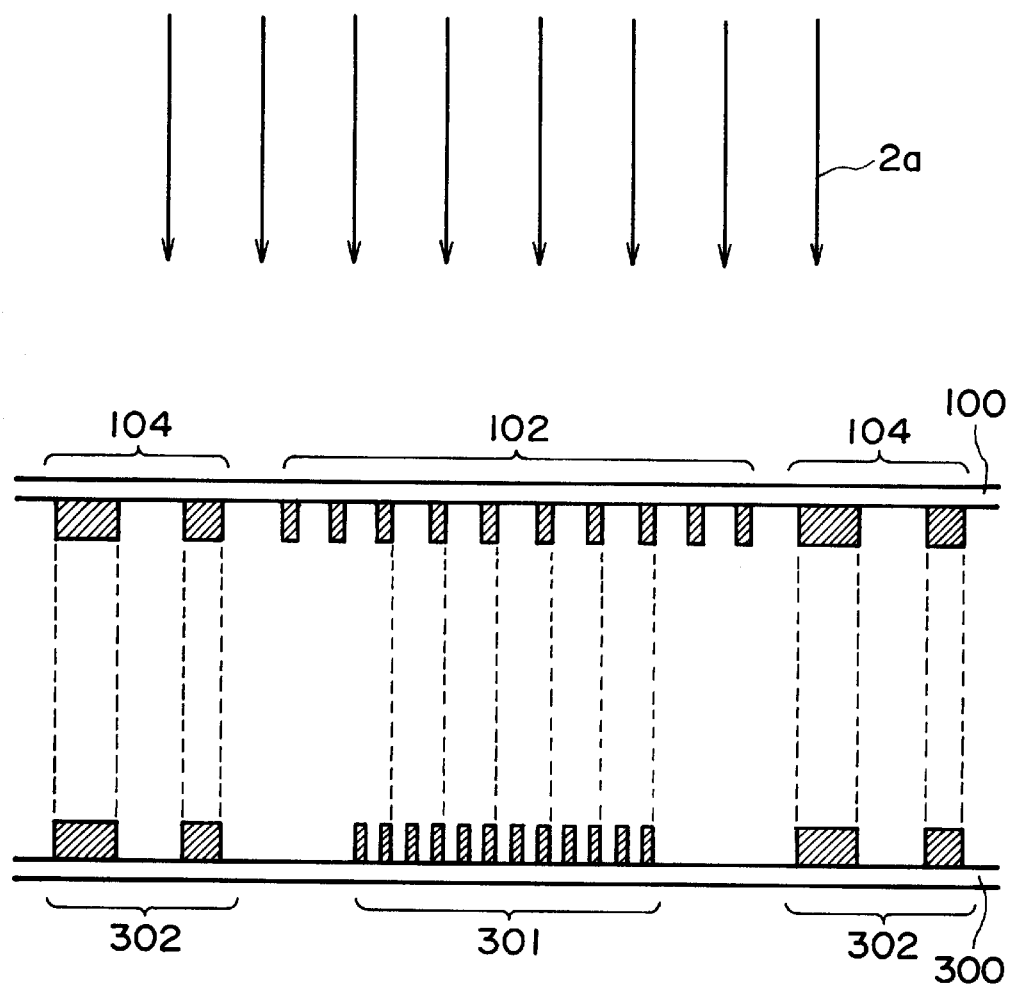
FIG. 3 is a schematic view for explaining a transferred image, in a section along a line A–A' in FIG. 2A.

FIG. 2A is a schematic view for explaining the structure of a mask for use in the manufacture of semiconductor devices, according to an embodiment of the present invention. FIG. 2B is a plan view for explaining positions of alignment marks upon a semiconductor wafer. FIG. 3 is a schematic view for explaining a transferred image, in a section along a line A–A' in FIG. 2A.

A mask 100 shown in FIG. 2A comprises a membrane 101 on which an X-ray absorbing material member is formed and shaped into a pattern. The pattern of the X-ray absorbing member includes periodic structure portions 102 and 103 (absorbing material pattern portions having a periodic structure), and non-periodic structure portions 104 (absorbing material pattern portions having no periodic structure). The membrane may comprise a 2-micron thickness of SiC or SiN, for example. As regards the X-ray absorbing material, tungsten (W), molybdenum (Mo) or tantalum (Ta), for example, may be used. The periodic structure portion 102 serves to exactly form inside elements of a semiconductor device therein, and it is defined to be wider than a zone 105 as required by a fine pattern. The periodic structure portions 103 are formed at alignment mark areas which are to be used for precisely superposing different layers of a semiconductor device or for registering masks (to be used for a multiple exposure process, to be described later) with respect to semiconductor chips. As shown in FIG. 2B, the alignment mark areas 103 are provided in relation to respective chips 201, and they are disposed outside the chips, for example, along scribe lines. The mask 100 described above can be manufactured in accordance with a currently available mask manufacturing technique, and the absorbing material patterns at the periodic structure portions 102 and 103 have a line-and-space of 100 nm, while the absorbing material patterns at the non-periodic portions 104 also have a smallest line-and-space of 100 nm. In the non-periodic pattern portions 104, a pattern such as an electrode, for example, having a relatively large line-and-space, as can be formed at a sufficient resolution even with a conventional (current) method, is formed.

The periodic structure portions 102 and 103 have an absorbing material pattern of a shape like a diffraction grating. By setting the type of absorbing material to be used and the thickness thereof as well as a gap during X-ray exposure (that is, exposure gap) appropriately, an interference fringe due to Fresnel diffraction can be produced. In this embodiment, the type and thickness of the absorbing material as well as the exposure gap may be set so that the period of a Fresnel diffraction image becomes equal to ½ of the period of the absorbing material pattern 102 or 103. Under these conditions, as shown in FIG. 3, the mask 100 and a wafer 300 are placed in registration, with a spacing corresponding to the thus set gap maintained therebetween, and then X-rays 2a are projected to them. As a result, with the X-rays passing through the range 102 of the periodic structure portion of the mask 100, a stripe-like pattern 301 can be printed due to a diffraction image having a period (50 nm line-and-space=100 nm) which is a half (½) of the period (100 nm line-and-space=200 nm) of the periodic structure 102. Also, with the X-rays passing through the range 104 of the non-periodic structure portion of the mask 100, the pattern at the non-periodic structure portion 104 is printed at a unit magnification (smallest line-and-space=100 nm), into a unit-magnification pattern 302. Here, while not shown in FIG. 3, with the X-rays passing through the periodic structure portion 103, a stripe-like pattern of a period (50 nm line-and-space=100 nm) which is a half of the period of the periodic structure portion 103 is printed.

[Second Embodiment]

Next, an embodiment of forming an image of a stripe-like pattern (hereinafter, a fine pattern) of a half period such as described above, will be explained.

Figure 4:
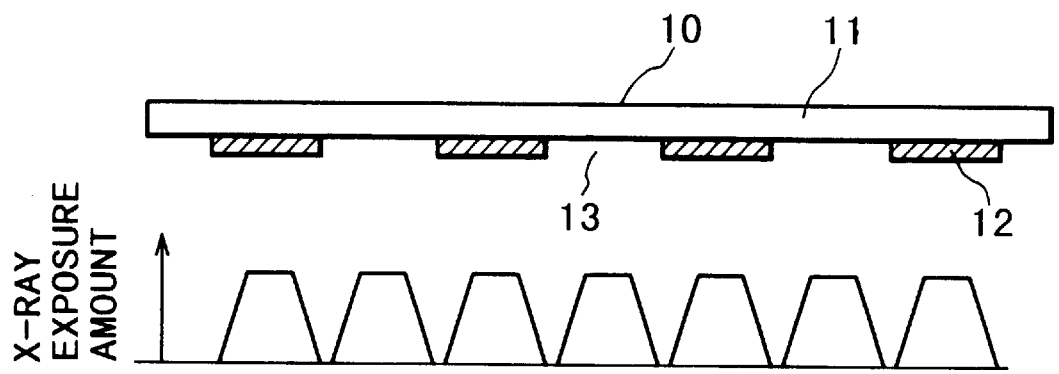
FIG. 4 is a schematic view for explaining a sectional structure of a periodic structure portion of the mask of FIG. 2A, as well as a fine pattern to be printed by use of that mask.

FIG. 4 is a schematic view for explaining a fine pattern mask to be used for forming a fine pattern, as well as a fine pattern (X-ray exposure amount) to be printed through X-ray exposure, by use of the fine pattern mask.

Denoted in the drawing at 10 is a fine pattern mask, and denoted at 11 is a membrane. Denoted at 12 is an absorbing material member. The membrane 11 may comprise a 2-micron thickness of SiC or SiN, for example, having a high X-ray transmission factor. As regards the X-ray absorbing material 12, tungsten, molybdenum or tantalum, for example, may be used. By using the X-ray absorbing material member 12, a pattern like a diffraction grating is formed on the membrane 11, whereby a fine pattern mask 10 is produced.

Here, the material and the thickness of the X-ray absorbing member 12 as well as the gap (exposure gap) between the mask 10 and a workpiece (such as a semiconductor wafer having a resist coating thereon) to be defined during the exposure process, are set so that the intensity below the absorbing member 12 and the intensity below the opening 13 become equal to each other. As a result of this, a fine linear pattern of a 100 nm period (50 nm line-and-space) can be printed while using a mask pattern of a 200 nm period (100 nm line-and-space) that can be met by a conventional (current) technique. Namely, by use of a mask of a smallest linewidth which can be met by a current manufacturing technique, a fine linear pattern having a linewidth, which is a half of that linewidth, can be printed.

As an alternative, a diffraction image of a period corresponding to 1/n of the mask line-and-space (where n is an integer not less than 3), may be produced and used.

Figure 1:
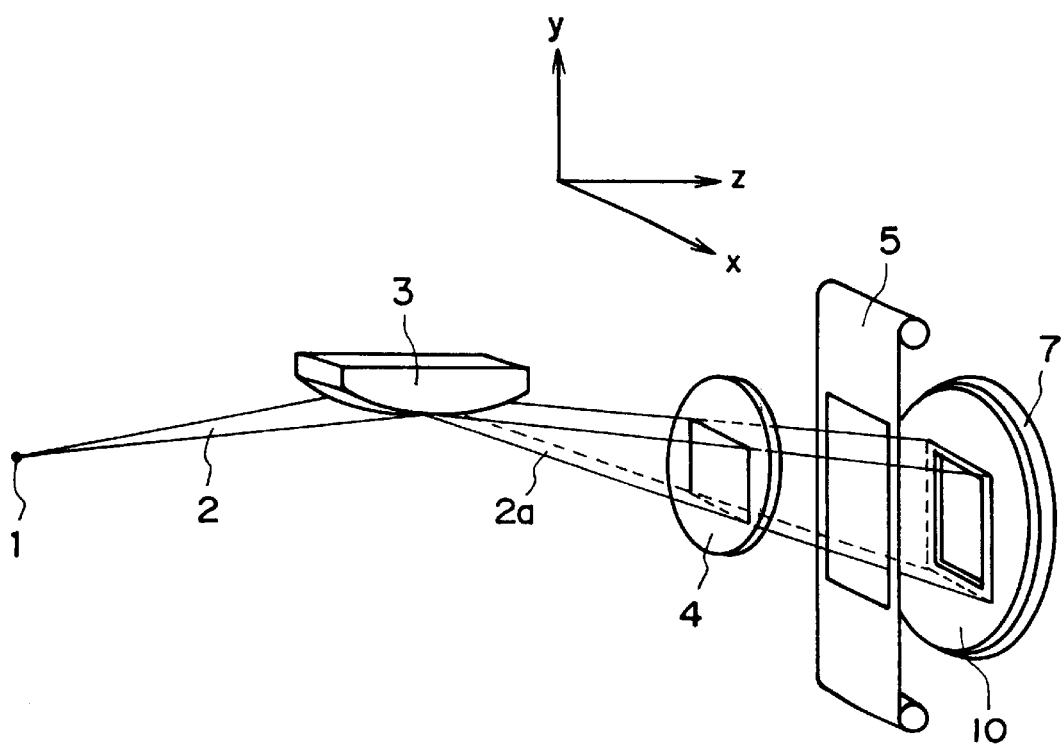
FIG. 1 is a schematic view of an X-ray proximity exposure apparatus of a known type.
Figure 5:
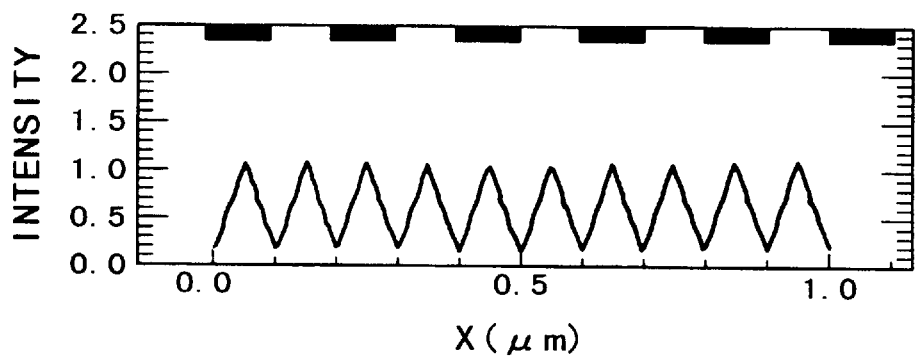
FIG. 5 is a chart of simulation of an exposure intensity distribution, in the state of exposure shown in FIG. 4.
Figure 6:
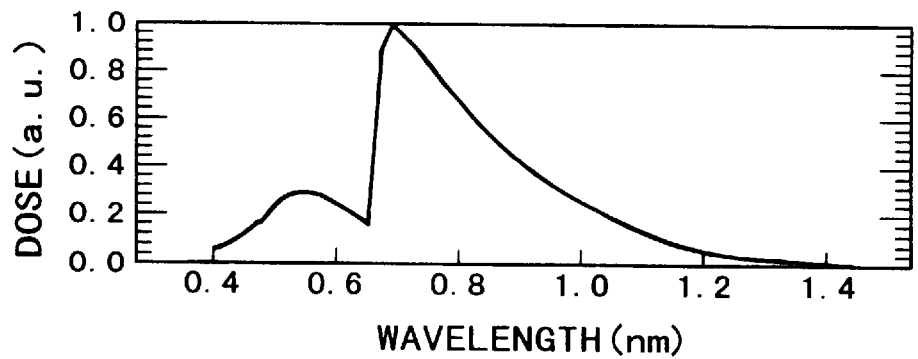
FIG. 6 is a graph of an example of X-ray spectrum upon the surface of a workpiece to be exposed.

FIG. 5 is a graph chart of simulation of an exposure intensity (exposure amount) distribution to be produced upon a workpiece 7 through Fresnel diffraction of X-rays, in an example where: the X-ray source 1 (FIG. 1) comprises a synchrotron orbit radiation of 585 MeV and a radius 0.593 m; the SiC mirror 3 has a glancing angle of 15 mrad; the beryllium film 4 has a thickness 18 microns; the mask 10 (FIG. 4) has a membrane 11 of 2-micron thickness of SiC on which an absorbing material member 12 of 0.40-micron thickness tungsten (W) is formed in a stripelike pattern of line-and-space of a 100 (nm):100 (nm) ratio; and the gap (exposure gap) between the mask 10 and the workpiece 7 is kept at 32 microns. The X-ray spectrum impinging on the mask 10 is based on actually measured values, shown in FIG. 6. It is seen from the result of simulation that a fine linear pattern of a 100 nm period (line-and-space=50 nm) can be produced with high contrast.

Figure 7:
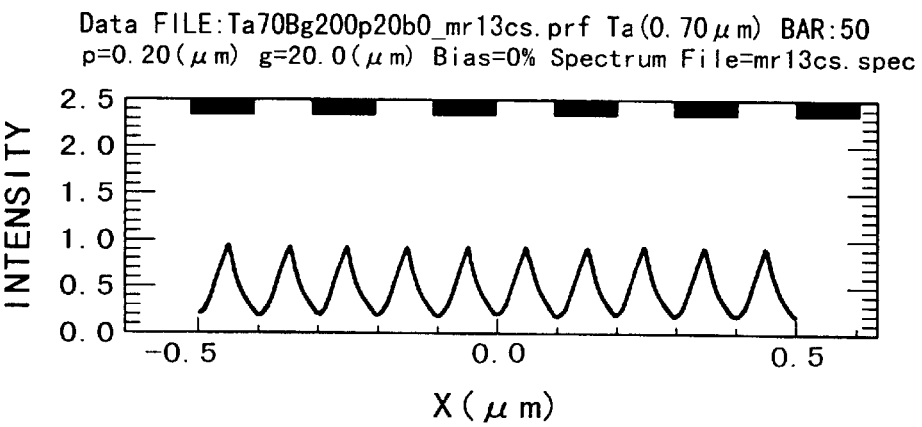
FIG. 7 is a chart of simulation of an exposure intensity distribution to be provided by a mask having a pattern shape the same as that of FIG. 4 and having an X-ray absorbing member different from that of FIG. 4 with respect to the material and the thickness.

FIG. 7 is a graph chart of simulation of a distribution (exposure amount distribution) of an X-ray diffraction image to be produced upon a workpiece 7, under the same conditions as those of FIG. 5 except that: the absorbing member 12 of the mask is made from a 0.70-micron thickness of tantalum (Ta); and the exposure gap is 20 microns.

It is seen from the results of these simulations that, when the material and the thickness of the absorbing member 12 as well as the exposure gap are set appropriately, a fine linear pattern of a 100 nm period can be produced with high contrast.

[Third Embodiment]

Next, an embodiment will be described of a method of manufacturing a semiconductor device having a smallest linewidth (smallest line-and-space) of 50 nm, on the basis of superposed printing of the mask of FIG. 2A and a rough pattern, to be described later.

As regards a rough pattern, a desired mask pattern may be used and printed at a desired location where a fine pattern should be left.

A fine pattern and a rough pattern such as described above may be exposed respectively by individual exposure amounts, each being at a level lower than the exposure amount threshold of a resist upon a workpiece but, when combined, the sum of them being at a level higher than the exposure threshold. As a result, a pattern can be formed only in such a portion having been exposed superposedly. Namely, in that portion, a pattern can be formed with a precision of the fine pattern. Here, either the fine-pattern exposure or the rough-pattern exposure may be made first. The rough pattern exposure may be made under a condition different from that for the fine pattern exposure. For example, a different material or a different thickness for the absorbing member, or a different exposure gap, may be selected. They may be determined in accordance with conditions for accomplishing a desired rough pattern.

It is to be noted that the portion of the rough pattern mask (where the rough pattern is to be formed) which is other than the portion to be used for the superposed printing with the fine pattern, as well as the pattern of the non-periodic structure portion 104 of the mask of FIG. 2A, may be formed with the same structure as that of the corresponding portion of a conventional mask pattern.

A desired rough pattern may be a pattern having a large opening or a small pattern produced in accordance with a conventional technique, for example. Alternatively, it may be a pattern based on a peak of Fresnel diffraction.

Namely, a rough pattern may be formed with an opening larger than a fine pattern, and a pattern corresponding to the position of the opening of the rough pattern may be transferred. By doing so, the contrast and precision can be improved, still on the basis of a conventional mask manufacturing technique.

There is a further advantage that a tolerance for a variation in the exposure amount or a tolerance for a variation in the exposure gap, for exposure of a small pattern (e.g., 50 nm line-and-space) as produced on the basis of a conventional technique (e.g., 100 nm line-and-space), can be enlarged. Namely, the resolution can be improved. In addition, even in a case where the contrast is too low to be resolved only through the Fresnel diffraction of a rough pattern, the exposure process may be performed while a peak of Fresnel diffraction of a rough pattern and a peak of Fresnel diffraction of a fine pattern are kept registered with each other, by which a high contrast can be assured and the resolution can be improved.

The principle of a dual exposure process with a fine pattern and a rough pattern, according to this embodiment of the present invention will be described in greater detail, in conjunction with FIGS. 8–11.

Figure 8:
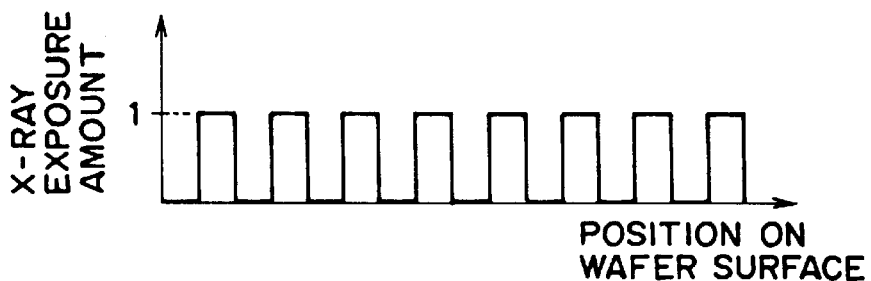
FIG. 8 is a graph of an exposure intensity distribution of a fine pattern, for explaining the principle of dual exposure to be performed by use of the mask of FIG. 2A.
Figure 9:
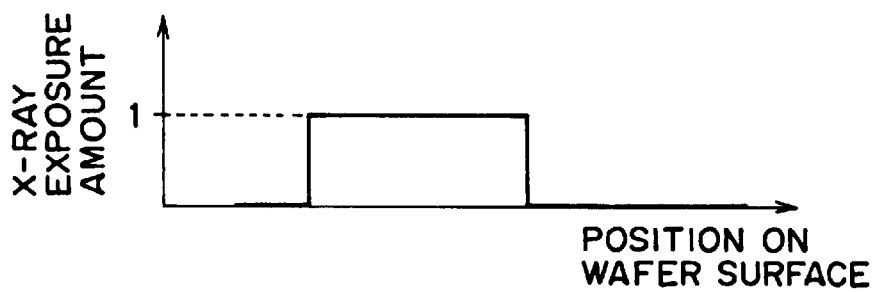
FIG. 9 is a graph of an exposure intensity distribution of a rough pattern, for explaining the principle of the dual exposure process.
Figure 10:
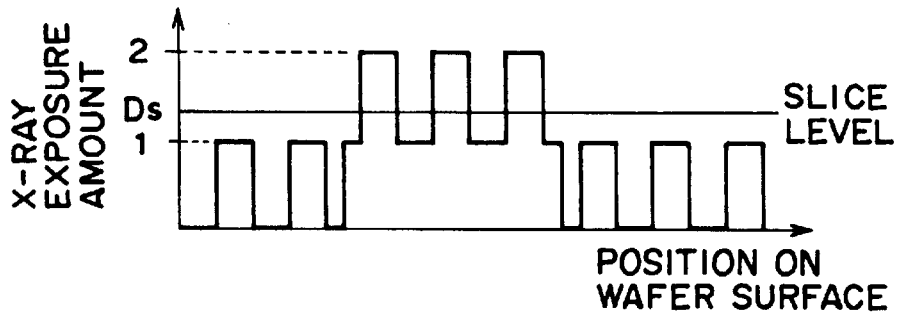
FIG. 10 is a graph of a combined exposure intensity distribution, wherein those of the fine pattern of FIG. 8 and of the rough pattern of FIG. 9 are combined with each other.
Figure 11:
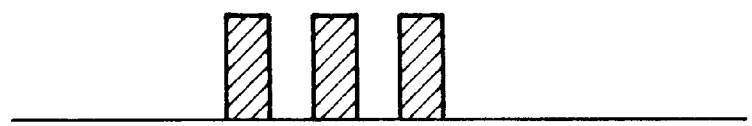
FIG. 11 is a schematic view of an example of a resist pattern to be produced in accordance with the exposure intensity distribution of FIG. 10 and through a development process to be performed after the exposure process.

As an example, a fine pattern may be exposed or photoprinted with an exposure amount (1), as shown in FIG. 8. Thereafter, as shown in FIG. 9, a rough pattern having a linewidth corresponding to three periods of the fine pattern is photoprinted with an exposure amount (1). Then, as shown in FIG. 10, a portion where the fine pattern and the rough pattern are printed superposedly bears an exposure amount (2), whereas a portion exposed with either the fine pattern or the rough pattern only bears an exposure amount (1). The remaining portion bears a zero exposure amount (0). Therefore, as shown in FIG. 10, where the exposure threshold Ds is set at a level between the exposure amounts (1) and (2), only the portion where the fine pattern and the rough pattern are printed superposedly can be developed, as shown in FIG. 11. Here, the exposure amount (1) or (2) is referred to only for convenience in explanation, and it does not have a specific physical significance.

Figure 12:
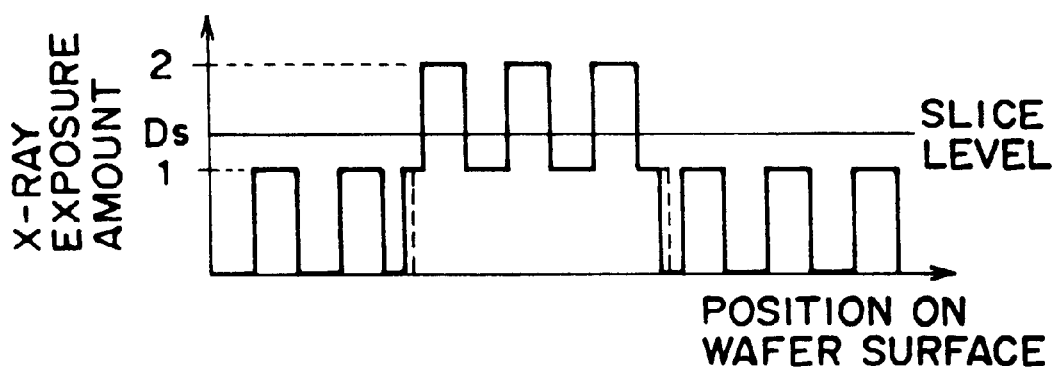
FIG. 12 is a graph of an exposure intensity distribution, for explaining a case where, in FIG. 10, the position of the rough pattern of FIG. 9 is shifted.
Figure 13:
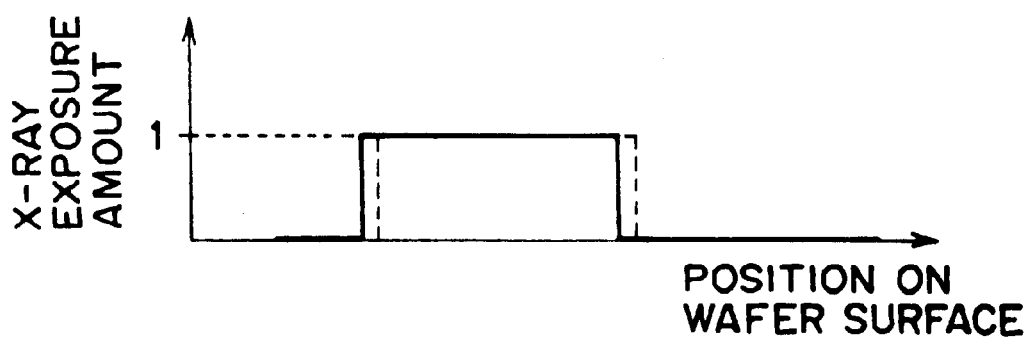
FIG. 13 is a graph of an exposure intensity distribution, for explaining a case where, in FIG. 9, the position of the rough pattern is shifted.

Advantages of such a dual exposure process will be described below. Broken lines in FIGS. 12 and 13 depict an exposure amount distribution on an occasion when the rough pattern of FIG. 9 is printed with a deviation from the correct transfer position (solid line position) in FIGS. 13 and 9 where the pattern should be printed correctly. If the position of the rough pattern shifts such as described above, the exposure amount distribution changes slightly from the solid-line distribution to be provided correctly. However, there occurs no change in the portion to be exposed with an exposure amount (2). Namely, even if the rough pattern transfer position shifts slightly, the resist pattern after a development process can be formed exactly at the same position as the case of FIG. 11 where the rough pattern transfer position is not deviated. Similarly, any fault of the rough pattern such as a void, does not apply an adverse influence.

In the dual exposure process of this embodiment, an exposure region may be divided into zones in accordance with a fine pattern, and a range for divided zones may be selected in accordance with a rough pattern. The precision therefor is determined by the fine pattern, and there is substantially no influence to the precision of a pattern resulting, after development, from the rough pattern. Thus, there is a large advantage that a pattern having been manufactured in accordance with a conventional technique can be photoprinted at a high resolution, by use of a conventional X-ray exposure apparatus.

In this embodiment, in the zone 105 as required by a fine pattern of a single chip 201 as well as in the alignment mark areas 103, a fine pattern as provided by the periodic structure portion 102 or 103 of the mask 100 (FIG. 2A) and the rough pattern described above are printed superposedly by dual exposure, whereby a pattern of a smallest line-and-space of 50 nm can be formed there.

Also, as regards the pattern at the non-periodic structure portion 104 of the mask of FIG. 2A, a pattern of the same structure is printed together with the above-described rough pattern in a unit magnification. Thus, through such dual exposure, an exposure amount which exceeds the resist exposure threshold level is applied to the resist material below the opening of the pattern 104. As a result, if the resist is a positive type, that portion of the resist can be left, whereas, if the resist is a negative type, that portion of the resist can be removed.

The inside area of the selected zones or a portion where only the precision or resolution for the rough pattern is sufficient, may be exposed by use of a third mask (i.e., a second rough pattern mask) for X-ray transmission, so that the exposure threshold level may be exceeded. On that occasion, the (first) rough pattern mask and the second rough pattern mask to be used for the dual exposure may be combined into a single mask, that is, a rough pattern mask having a locally adjusted transmission factor, such that a desired pattern can be produced through twice exposures only.

[Alternative Forms]

As regards the fine pattern, in the embodiments described above, a pattern with a line-and-space (period) which is a half of that of a mask pattern is printed on the basis of the X-ray interference. However, a pattern with a line-and-space which is 1/n (where n is an integer not less than 3) of that of the mask pattern, may be photoprinted, through the X-ray interference.

The rough pattern, the non-periodic structure portion and the periodic structure portion of the mask may comprise absorbing members of either the same material or different materials, and they may have either the same thickness or different thicknesses. In relation to the periodic structure portion for the fine pattern, the material and/or the thickness of the absorbing member should be selected so that an exposure intensity distribution of a period corresponding to 1/n magnification (n is an integer not less than 2) can be produced on the basis of interference of X-rays. However, in relation to the unit-magnification transfer for the rough pattern or the non-periodic structure portion, on the other hand, there is no necessity of satisfying the interference condition as in the case of the fine pattern. Therefore, an absorbing member and a thickness that enables high contrast, can be selected. This prevents fogging in the pattern transfer.

The exposure process using a mask such as shown in FIG. 2A and the exposure process using a rough pattern, may be performed either with the same exposure gap or with different exposure gaps. For the fine-pattern transfer, an exposure gap that satisfies a condition for interference should be selected. On the other hand, for the rough-pattern transfer, since it is not necessary to satisfy the condition for interference as in the case of the fine pattern, an exposure gap that attains high pattern correctness can be selected. Alternatively, an exposure gap with which a peak position of exposure intensity of a fine pattern and a peak position of exposure intensity of a rough pattern can be registered with each other, may be selected.

The exposure amount for the rough pattern and the exposure amount using the mask of FIG. 2A can be determined as desired, in accordance with experiments or calculations.

In the embodiments described above, a mask is manufactured in accordance with a conventional mask manufacturing technique, and an exposure process for the mask is performed by use of a conventional exposure apparatus. It is to be noted here that the present invention can still be applied when the mask manufacturing technique is improved or the precision and resolution of an exposure apparatus is improved, and that the invention can be embodied by use of such an improved mask manufacturing technique or improved exposure apparatus. Namely, while using a mask manufacturing technique and an exposure apparatus which are available at that time, a precision and a resolution, higher than those attainable with an ordinary exposure method, can be accomplished with the present invention.

Next, an embodiment of a device manufacturing method which is based on an exposure method described above, will be explained.

Figure 14:
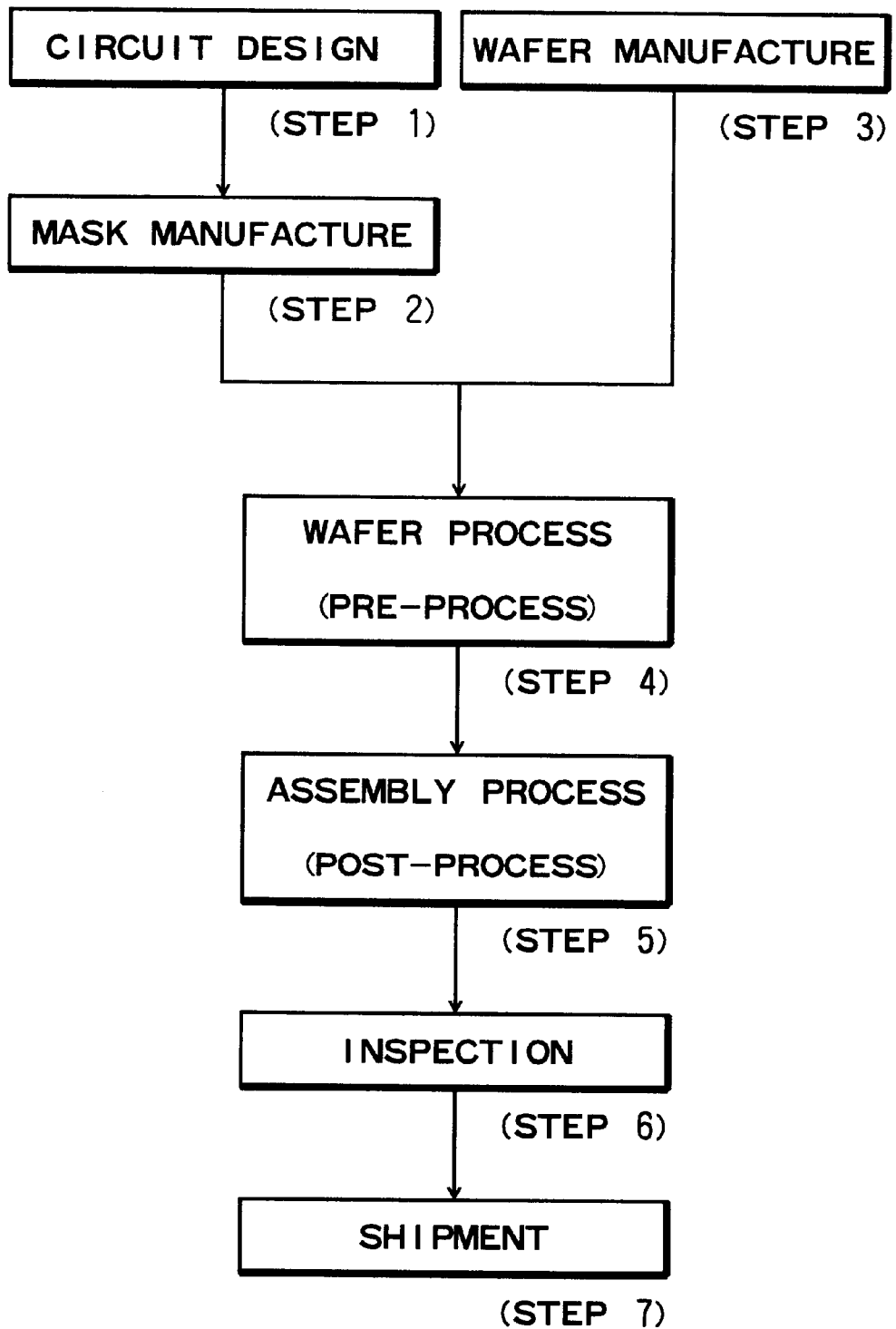
FIG. 14 is a flow chart of microdevice manufacturing processes.

FIG. 14 is a flow chart of a procedure for the manufacture of microdevices such as semiconductor chips (e.g., ICs or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 15:
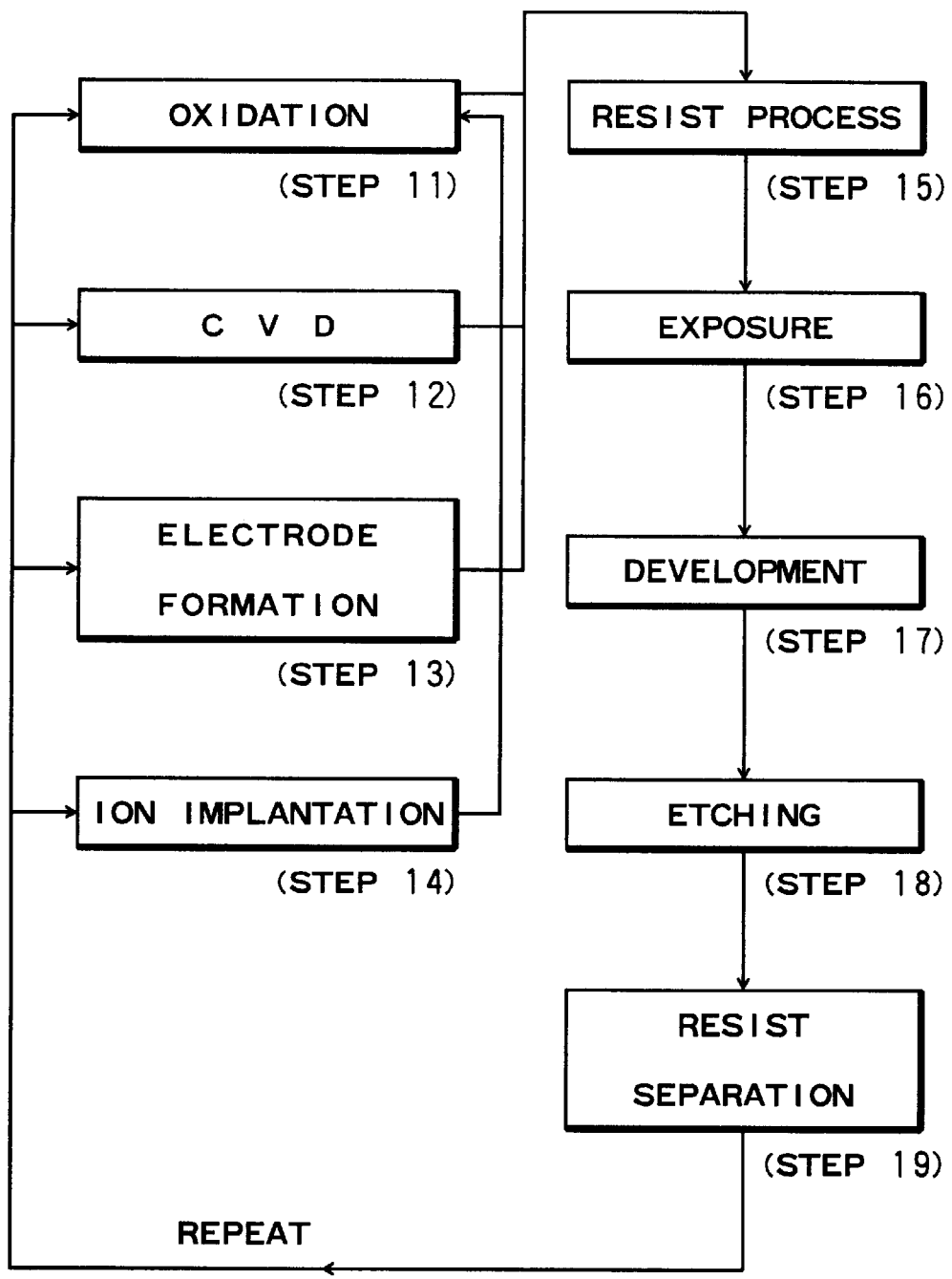
FIG. 15 is a flow chart for explaining details of a wafer process in the procedure of FIG. 14.

FIG. 15 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with the embodiments of the present invention as described hereinbefore, while using a mask pattern and an exposure apparatus which can be prepared by current techniques, a pattern including a periodic pattern having a smallest linewidth corresponding to 1/n of the smallest linewidth that can be attained in accordance with an ordinary exposure method, using such a mask and an exposure apparatus, can be formed through a single exposure operation. Further, the exposure such as described above may be performed as a first exposure, while on the other hand, a second exposure of unit-magnification exposure using a rough pattern having a smallest linewidth larger than that of the periodic pattern may be performed additionally, with individual exposure amounts each being at a level lower than the exposure amount threshold of a resist upon a workpiece but, when combined, the sum of them being at a level higher than the exposure threshold. By this procedure, a desired pattern including a smallest linewidth of the periodic pattern can be formed. Further, when alignment marks are formed on the basis of pattern images of a 1/n magnification of the period, any errors of the marks can be averages, such that a high precision alignment operation is assured.

The portions of masks used in the first and second exposures for unit-magnification transfer may have the same structure. This enables that, without a complicated procedure, the exposure amount in the portion corresponding to the unit-magnification transfer exceeds the exposure threshold of the resist.

The present invention can be embodied by use of a mask manufacturing technique and an exposure apparatus which are available at the present stage or in the future, but still accomplishes a precision and a resolution which are higher than those as attainable with the use of the same exposure apparatus and a unit-magnification transfer mask produced in accordance with the same mask manufacturing technique.

There are various advantageous effects involved, such as follows.

(1) Since the final pattern position strongly depends on the transfer position of the fine pattern, there occurs substantially no positional error provided that the transfer position of the fine pattern is correct.

(2) Since the final pattern image strongly depends on a transferred image of the fine pattern, a defect in the rough pattern, if any, is not easily transferred provided that the transferred image of the fine pattern is uniform.

(3) Since the transferred image of the fine pattern is formed through interference between plural patterns, a particular defect in the fine pattern mask (e.g., a pattern defect such as a void, or a positional error thereof), if any, is not substantially transferred.

While the invention has been described with reference to the structures disclosed herein, it is not confined to the details set forth and this application is intended to cover such modifications or changes as may come within the purposes of the improvements or the scope of the following claims.

What is claimed is:

1. An exposure method for printing a pattern onto a workpiece to be exposed, said method comprising:
   a first exposure step for forming, on the workpiece and by exposure, a transferred image of a first absorbing material pattern formed on a mask and having no periodic structure; and
   a second exposure step for printing on the workpiece and by exposure, a diffraction pattern to be produced through Fresnel diffraction due to a second absorbing material pattern formed on the mask and having a periodic structure, the diffraction pattern having a period corresponding to 1/n of a period of the transferred image of the periodic structure pattern, where n is an integer not less than 2,
   wherein the first and second exposure steps are performed simultaneously.

2. A method according to claim 1, further comprising a third exposure step which is based on only a transferred image through an absorbing material pattern of the mask, wherein the third exposure step is performed at a timing separate from the first and second exposure steps, and exposures in the second and third exposure steps are performed superposedly upon the workpiece.

3. A method according to claim 2, wherein the transferred image through the exposure in the first exposure step and the diffraction pattern through the exposure in the second exposure step are formed in different regions on the workpiece, respectively.

4. A method according to claim 2, wherein the first absorbing material pattern having no periodic structure has the same structure as that of a corresponding portion of the absorbing material pattern in the third exposure step.

5. A method according to claim 2, wherein, in the second exposure step, the diffraction pattern is printed with an exposure amount lower than an exposure threshold level of the workpiece, and the third exposure step is performed so that the exposure amount at a portion of the diffraction pattern to be superposedly exposed by the third exposure step exceeds the exposure threshold level.

6. A method according to claim 2, wherein the diffraction pattern printed by the second exposure step is contributable to form a smallest linewidth pattern on the workpiece, in combination with a developing process for the workpiece.

7. A method according to claim 6, wherein a region where the diffraction pattern is to be formed through the second exposure step is larger than a region where the smallest linewidth pattern is to be formed.

8. A method according to claim 1, further comprising forming an alignment mark to be used for alignment of the workpiece, on the basis of one of an exposure through the second exposure step and a superposed exposure through the second and third exposure steps.

9. A method according to claim 1, wherein the first and second exposure steps are performed on the basis of an X-ray proximity exposure system.

10. A mask structure for use in printing a pattern on a workpiece to be exposed, said mask structure comprising:
    a first absorbing material pattern having no periodic structure, wherein a transferred image of the first absorbing material pattern can be formed on the workpiece;
    a second absorbing material pattern having a periodic structure, wherein a diffraction pattern of a period corresponding to 1/n of the period of the transferred image of the periodic structure pattern, where n is an integer not less than 2, which diffraction pattern is to be produced through Fresnel diffraction due to the second absorbing material pattern, can be printed on the workpiece.

11. A mask structure according to claim 10, wherein the diffraction pattern is produced on the workpiece, for superposed exposure of the workpiece in association with a transferred image of a third absorbing material pattern, separate from the first and second absorbing material patterns.

12. A mask structure according to claim 11, wherein the first absorbing material pattern having no periodic structure has the same structure as that of a corresponding portion of the third absorbing material pattern.

13. A mask structure according to claim 10, further comprising a separate absorbing material pattern having a periodic structure which is provided as an alignment mark portion thereon.

14. A mask structure according to claim 10, wherein said mask structure is adapted to be used with an X-ray proximity exposure system.

15. A device, comprising:
    a substrate; and
    a pattern formed on the substrate in accordance with a procedure which includes (i) an exposure process for printing a pattern onto a workpiece to be exposed, the exposure process including (a) a first exposure step for forming, on the workpiece and by exposure, a transferred image of a first absorbing material pattern formed on a mask and having no periodic structure, and (b) a second exposure step for printing, on the workpiece and by exposure, a diffraction pattern to be produced through Fresnel diffraction due to a second absorbing material pattern formed on the mask and having a periodic structure, the diffraction pattern having a period corresponding to 1/n of a period of the transferred image of the periodic structure pattern, where n is an integer not less than 2, and wherein the first and second exposure steps are performed simultaneously, and (ii) a development process for developing the pattern exposed workpiece, so that a circuit pattern can be formed on the workpiece.

16. A device manufacturing method, comprising:
    an exposure process for printing a pattern onto a workpiece to be exposed, the exposure process including (i) a first exposure step for forming, on the workpiece and by exposure, a transferred image of a first absorbing material pattern formed on a mask and having no periodic structure, and (ii) a second exposure step for printing, on the workpiece and by exposure, a diffraction pattern to be produced through Fresnel diffraction due to a second absorbing material pattern formed on the mask and having a periodic structure, the diffraction pattern having a period corresponding to 1/n of a period of the transferred image of the periodic structure pattern, where n is an integer not less than 2, and wherein the first and second exposure steps are performed simultaneously; and
    a development process for developing the pattern exposed workpiece, so that a circuit pattern can be formed on the workpiece.

17. An exposure method according to claim 16, wherein the exposure process further includes a third exposure step which is based on only a transferred image through an absorbing material pattern of the mask, wherein the third exposure step is performed at a timing separate from the first and second exposure steps, and wherein exposures in the second and third exposure steps are performed superposedly upon the workpiece.

UNITED STATES PATENT AND TRADEMARK OFFICE
CERTIFICATE OF CORRECTION

PATENT NO. : 6,272,202 B1
DATED : August 7, 2001
INVENTOR(S) : Keiko Chiba et al.

It is certified that error appears in the above-identified patent and that said Letters Patent is hereby corrected as shown below:

<u>Title page,</u>
FOREIGN PATENT DOCUMENTS,

"407312339" should read -- 7-312339 --;
"2-110311" should read -- 2-100311 --.

<u>Column 1,</u>
Line 22, "¶ Denoted" should read -- Denoted --.

<u>Column 4,</u>
Line 35, "thickness" should read -- thickness of --.

<u>Column 6,</u>
Line 53, "twice" should read -- two --.

Signed and Sealed this

Fifth Day of March, 2002

Attest:

JAMES E. ROGAN
*Director of the United States Patent and Trademark Office*

*Attesting Officer*